(12) United States Patent
Ozaki et al.

(10) Patent No.: US 11,155,083 B2
(45) Date of Patent: Oct. 26, 2021

(54) MEMBER TRANSFER METHOD AND MANUFACTURING METHOD FOR LIQUID EJECTION HEAD

(71) Applicant: CANON KABUSHIKI KAISHA, Tokyo (JP)

(72) Inventors: Teruo Ozaki, Yokohama (JP); Masaki Ohsumi, Yokosuka (JP); Tomohiko Nakano, Fukushima (JP); Seiichiro Yaginuma, Kawasaki (JP); Keiji Matsumoto, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/512,197

(22) Filed: Jul. 15, 2019

(65) Prior Publication Data

US 2020/0023640 A1    Jan. 23, 2020

(30) Foreign Application Priority Data

Jul. 19, 2018 (JP) .............................. JP2018-135903

(51) Int. Cl.
*B41J 2/14* (2006.01)
*G03F 7/09* (2006.01)

(52) U.S. Cl.
CPC ....... *B41J 2/14024* (2013.01); *B41J 2/14048* (2013.01); *G03F 7/092* (2013.01)

(58) Field of Classification Search
CPC .............................. B41J 2/1631; B41J 2/1623
See application file for complete search history.

(56) References Cited

U.S. PATENT DOCUMENTS

| 4,530,896 | A | * | 7/1985 | Christensen | ............. | G03C 1/52 |
| | | | | | | 430/143 |
| 4,889,790 | A | * | 12/1989 | Roos | ....................... | B32B 37/02 |
| | | | | | | 430/258 |
| 2015/0151544 | A1 | * | 6/2015 | Asai | ....................... | B41J 2/1645 |
| | | | | | | 156/247 |
| 2020/0094557 | A1 | * | 3/2020 | Nakano | .................. | B41J 2/1632 |

FOREIGN PATENT DOCUMENTS

JP         2006-137065 A         6/2006

* cited by examiner

*Primary Examiner* — Shelby L Fidler
(74) *Attorney, Agent, or Firm* — Canon U.S.A., Inc., IP Division

(57) ABSTRACT

A member transfer method includes sticking a member supported at a support to an object, thinning the support after the sticking of the member to the object, and removing the support from the member after the thinning of the support.

9 Claims, 6 Drawing Sheets

MEMBER TRANSFER METHOD AND MANUFACTURING METHOD FOR LIQUID EJECTION HEAD

BACKGROUND OF THE INVENTION

Field of the Invention

The present disclosure relates to a member transfer method and a manufacturing method of a liquid ejection head.

Description of the Related Art

A film-like member transfer technique used for forming a food packaging material or forming a wiring pattern of fine electronic components may be used for manufacturing a liquid ejection head which records an image by ejecting a liquid. Japanese Patent Application Laid-Open No. 2006-137065 discloses a method in which a dry film-like member (hereinafter, referred to as a "dry film") is transferred onto a substrate, and a channel formation member which is a structure having a liquid channel or an ejection port is formed by using the transferred dry film. In this method, the dry film before being transferred is supported at a support (peelable sheet), and the support is peeled from the dry film after the dry film is stuck to the substrate. The dry film on the substrate is patterned through, for example, photolithography, and thus a channel formation member having a desired structure is formed.

According to the method disclosed in Japanese Patent Application Laid-Open No. 2006-137065, when the support is peeled from the dry film, the dry film may be deformed or damaged. In a case where the dry film is deformed or damaged, a channel formation member having a desired structure is not formed, and there is also concern that particles separated from the dry film may fall and attach onto a substrate, and thus the quality of a liquid ejection head may be reduced.

SUMMARY OF THE INVENTION

According to the present disclosure, there is provided a member transfer method including sticking a member supported at a support to an object; thinning the support after the sticking of the member to the object; and removing the support from the member after the thinning of the support.

According to the present disclosure, there is provided another member transfer method including sticking a member supported at a support to an object; and removing the support through dissolution while the member is maintained in an undissolved state after the sticking of the member to the object.

Further features of the present disclosure will become apparent from the following description of exemplary embodiments with reference to the attached drawings.

DESCRIPTION OF THE EMBODIMENTS

Figure 1:
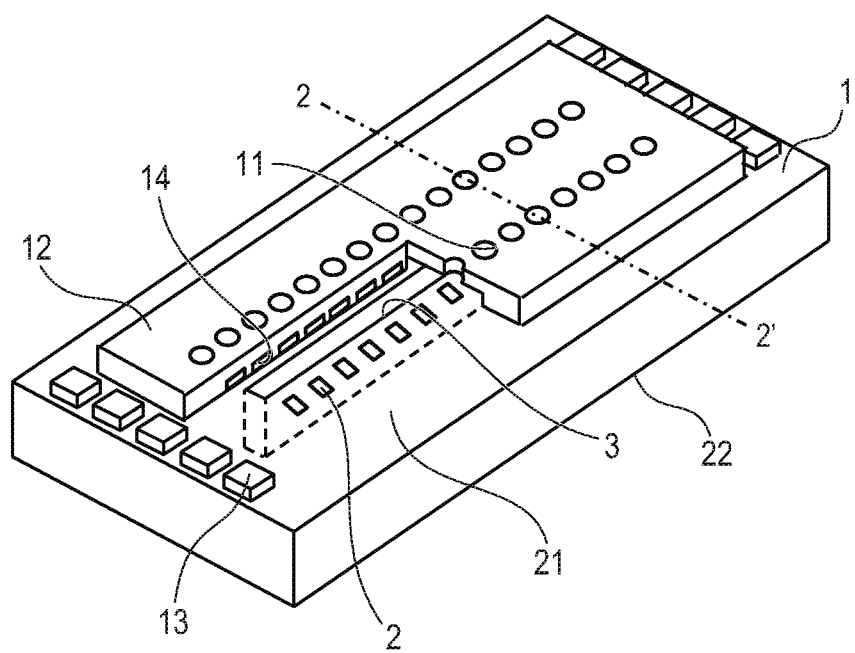
FIG. 1 is a perspective view illustrating an example of a liquid ejection head manufactured according to a method related to the present disclosure.

Hereinafter, embodiments of the present disclosure will be described with reference to the drawings.

Structure of Liquid Ejection Head

First, an example of a configuration of a liquid ejection head manufactured according to a method related to the present disclosure will be described. A liquid ejection head illustrated in FIG. 1 includes a substrate 1, and a channel formation member 12 stacked on the substrate 1. The substrate 1 is made of, for example, silicon, and has a first surface (an upper surface in FIG. 1) 21, a second surface (a lower surface in FIG. 1) 22 which is a rear surface thereof, and a supply path 3 which penetrates from the first surface 21 to the second surface 22. Energy generation elements 2 and terminals 13 connected to the energy generation elements 2 are formed on the first surface 21 side of the substrate 1. The energy generation elements 2 are heating resistors or piezoelectric elements, may be formed to be in contact with the first surface 21 of the substrate 1, and may be formed to be disposed with a gap with the first surface 21. The channel formation member 12 has channels 14 connected to the supply path 3 of the substrate 1, and ejection ports 11 which communicate with the channels 14. In a case where a liquid is supplied to the channels 14 of the channel formation member 12 from the supply path 3 of the substrate 1, and the energy generation elements 2 are driven by power supplied via the terminals 13 from the outside of the substrate 1, the liquid to which ejection energy is applied from the energy generation elements 2 is ejected out of the ejection ports 11.

First Embodiment

Figure 2A:
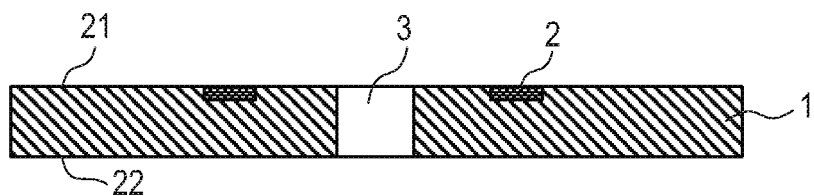
FIGS. 2A, 2B, 2C, 2D, 2E, 2F, 2G and 2H are sectional views sequentially illustrating respective steps in a transfer method according to a first embodiment of the present disclosure.
Figure 2B:
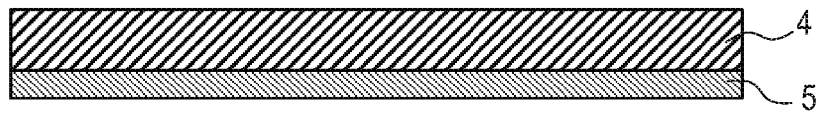

Next, a method of manufacturing the liquid ejection head illustrated in FIG. 1 will be described with reference to FIGS. 2A to 2H which are sectional views at a position corresponding to the line 2-2' in FIG. 1 based on a first embodiment of the present disclosure. As illustrated in FIG. 2A, the substrate (object) 1 is provided with the energy generation elements 2 on the first surface 21 side. The energy generation elements 2 may be covered with a protective film (not illustrated) made of SiN or $SiO_2$. The substrate 1 is provided with the supply path 3, and the supply path 3 is open to the first surface 21 of the substrate 1. A method of forming the supply path 3 in the substrate 1 may include, for example, laser processing, reactive ion etching, sand blast and wet etching. On the other hand, as illustrated in FIG. 2B, a dry film (member) 5 supported at a support 4 is prepared. Examples of the support 4 of the present embodiment may include a film, glass and silicon. Considering that the support 4 is to be peeled from the dry film 5 next, the film is preferably used. Examples of a material of the film forming the support 4 may include polyethylene terephthalate (PET), polyimide, polyamide, polyaramid, Teflon (registered trademark), polyvinyl alcohol, polycarbonate, polymethylpentene and cycloolefin polymer. The support 4 may have a single-layer structure made of one material selected among the materials, and may have a multi-layer structure made of one or a plurality of materials selected among the materials. In order for the support 4 to be easily peeled from the dry film 5, the surface of the support 4 in contact with the dry film 5 may be subjected to release treatment. The dry film 5 is made of a photosensitive resin, for example, an epoxy resin, an acrylic resin or a urethane resin. Examples of the epoxy resin may include bisphenol A type, cresol novolac type and alicyclic epoxy resins. An example of the acrylic resin may include polymethyl methacrylate. An example of the urethane resin may include polyurethane. Examples of a solvent dissolving such a resin may include propylene glycol methyl ether acetate (PGMEA), cyclohexanone, methyl ethyl ketone and xylene. Above all, the photosensitive resin, particularly, a negative type photosensitive resin is preferably used. A composition of such a resin is applied on the support 4 according to a spin coating method, a direct coating method (slit coating method) using a head with a slit or a spray coating method, so as to be dried, and thus the dry film 5 is formed on the support 4.

Figure 2C:
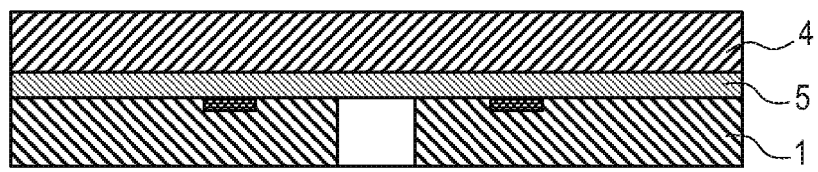

As illustrated in FIG. 2C, the dry film 5 (refer to FIG. 2B) supported at the support 4 is stuck to the first surface 21 of the substrate 1 (refer to FIG. 2A) provided with the supply path 3, and thus the dry film 5 which will be a part of the channel formation member 12 is formed on the substrate 1. The support 4 preferably has a thickness, a material, and a layer structure for giving sufficient rigidity thereto such that the transferred dry film 5 can maintain a favorable shape.

Next, the support 4 having the sufficient rigidity as described above is thinned as illustrated in FIG. 2D. Specifically, a thickness of the support 4 is preferably reduced to a half or less. In this case, a difference in the rigidity of the support 4 before and after being thinned is great, and, as will be described later, the dry film 5 is suppressed from being deformed during transfer of the dry film 5 and during peeling of the support 4, and this contributes to maintaining of a favorable shape thereof. Thinning of the support 4 is performed through polishing, dissolution using a solvent and peeling. In a case where the support 4 has a single-layer structure, the support 4 is preferably thinned through polishing. In a case where the support 4 has a multi-layer structure, at least one (at least outermost layer) of layers forming the support is preferably removed through polishing, dissolution using a solvent or peeling. In a case where the support 4 having a multi-layer structure is thinned through dissolution using a solvent, for example, there may be a method in which a water-soluble film made of polyvinyl alcohol as a raw material is used to form at least some layers of the support 4, and the corresponding layer (polyvinyl alcohol layer) is removed by using water. In a case where the support 4 having a multi-layer structure is thinned through removal using peeling, treatment has been preferably performed thereon such that releasability between a removed layer and a remaining film without being removed is higher than releasability of the surface in contact with the dry film 5. Consequently, desired layers can be peeled from each other while preventing the occurrence of peeling between the support 4 and the dry film 5. The peeling between layers of the support 4 having a multi-layer structure as mentioned above is referred to as "inter-layer peeling".

Figure 2D:
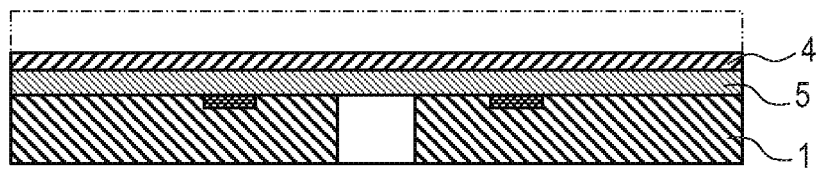
Figure 2E:
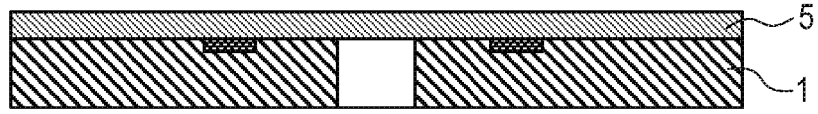

As described above, the support 4 is thinned, and then the thinned support 4 is peeled from the dry film 5. FIG. 2E illustrates a state after the support 4 is peeled. The peeling between the support 4 and the dry film 5 is referred to as "interfacial peeling". As described above, since the support 4 is thinned, the rigidity of the support 4 is reduced, and thus peeling stress applied to the dry film 5 during interfacial peeling is alleviated. As a result, deformation or damage of the dry film 5 can be suppressed. Particularly, in a case where the support 4 has a multi-layer structure, the rigidity of at least one of layers removed before interfacial peeling is higher than that of a layer which remains during interfacial peeling and is close to the dry film 5. With this configuration, a great difference between the rigidity of the support 4 during transfer of the dry film 5 and the rigidity of the support 4 during interfacial peeling can be provided. As a result, the channel formation member 12 illustrated in FIG. 1 is easily formed in a desired shape.

Figure 2F:
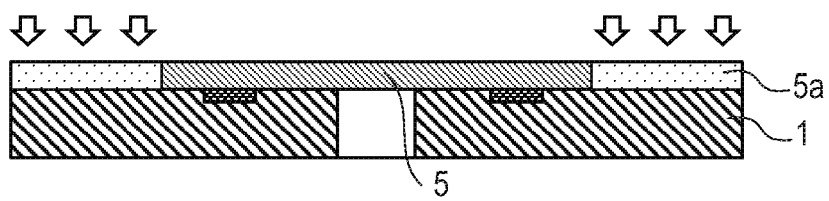
Figure 2G:
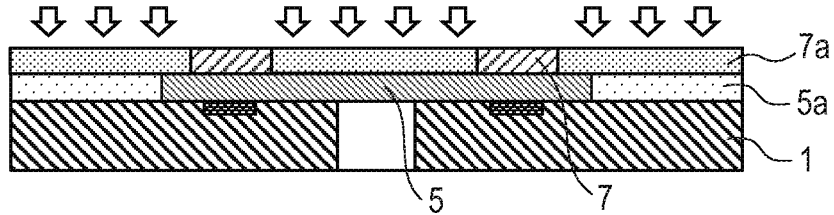
Figure 2H:
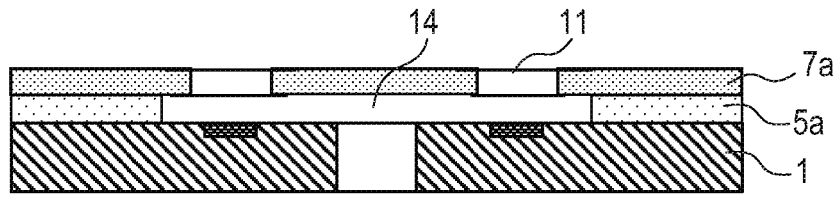

As mentioned above, after the support 4 is thinned and is peeled from the dry film 5, as illustrated in FIG. 2F, the dry film 5 is partially exposed to light, and thus a pattern serving as the channel 14 illustrated in FIG. 2H is formed. Herein, an example of using a negative type photosensitive resin as the dry film 5 is described, and a portion (a portion serving as a part of the channel formation member 12) serving as a sidewall of the channel 14 is exposed to light such that an unexposed portion is a pattern serving as the channel 14. Since a part of the dry film 5 is exposed to light and is cured as mentioned above, the portion serving as the sidewall of the channel 14 is formed, and the portion is indicated by the reference sign 5a in FIGS. 2F and 2G. As illustrated in FIG. 2G, a resin layer 7 serving as another part of the channel formation member 12 is formed on the dry film 5. The resin layer 7 is exposed to light such that a pattern serving as the ejection ports 11 illustrated in FIG. 2H is formed. Herein, an example of using a negative type photosensitive resin as the resin layer 7 is described, and a portion (a member forming the ejection ports) serving as a part of the channel formation member 12 is exposed to light such that an unexposed portion is a pattern serving as the ejection port 11. As mentioned above, since a part of the resin layer 7 is exposed to light and is cured, the member forming the ejection ports is formed, and the portion is indicated by the reference sign 7a in FIG. 2H. A main material of the resin layer 7 is the same as resin as that of the dry film 5, and is adjusted to have sensitivity or a photosensitive wavelength range which is different from that of the dry film 5 by adding a photoacid generator thereto. The dry film 5 and the resin layer 7 are developed to be partially removed, and thus the channel 14 and the ejection ports 11 are formed as illustrated in FIG. 2H. In the above-described way, the liquid ejection head illustrated in FIG. 1 is manufactured.

A technical meaning of the liquid ejection head manufacturing method of the present embodiment will be described. In the present embodiment, the dry film 5 supported at the support 4 is transferred onto the substrate 1 in order to stack the channel formation member 12 on the substrate 1. As mentioned above, when the dry film 5 is stuck (transferred) onto the substrate 1, in a case where the support 4 supporting the thin dry film 5 does not have sufficient rigidity, the dry film 5 is transferred to track an uneven shape of the front surface (one surface 21) of the substrate 1. As a result, there is a probability that the channel formation member 12 having a desired shape may not be formed. On the other hand, in a case where the rigidity of the support 4 is high when the support 4 is peeled from the transferred dry film 5, there is concern that the dry film 5 may be pulled to the support 4 side to be peeled so as to be deformed or damaged. As mentioned above, in a case where the rigidity of the support 4 is low, there is concern that the dry film 5 may be deformed due to the uneven shape of the first surface 21 of the substrate 1 during transfer of the dry film 5. However, in a case where the rigidity of the support 4 is high, there is concern that the dry film 5 may be deformed or damaged during peeling of the support 4 from the dry film 5. In either case, it is difficult to form the channel formation member 12 having a favorable shape.

In contrast, in the present embodiment, the dry film 5 supported at the support 4 having sufficiently high rigidity is transferred onto the substrate 1, and then the support 4 is thinned such that the rigidity thereof is reduced. The support 4 having low rigidity through thinning is peeled from the dry film 5. In the present embodiment, since the process of thinning the support 4 is performed between the step of transferring the dry film 5 and the step of removing the support 4, the rigidity of the support 4 is high during transfer of the dry film 5, and the rigidity of the support 4 is low during peeling of the support 4 from the dry film 5. Therefore, it is possible to suppress the dry film 5 from tracking the uneven shape of the front surface (one surface 21) of the substrate 1 during transfer of the dry film 5, and also to suppress the dry film 5 from being pulled to the support 4 side so as to be deformed or damaged during peeling of the support 4. In the above-described way, according to the present embodiment, deformation or damage of the dry film 5 can be suppressed, and thus it is possible to facilitate favorable formation of the channel formation member 12 having a desired shape. As a difference between the rigidity of the support 4 during transfer of the dry film 5 onto the substrate 1 and the rigidity of the support 4 during peeling of the support 4 from the dry film 5 becomes greater, the effect of the present embodiment becomes more remarkable.

Second Embodiment

Next, a manufacturing method for a liquid ejection head of a second embodiment of the present disclosure will be described with reference to FIGS. 2A to 2H and FIGS. 3A and 3B. Also in the present embodiment, in the same manner as in the first embodiment, the substrate 1 as illustrated in FIG. 2A and the dry film 5 supported at the support 4 as illustrated in FIG. 2B are prepared. As illustrated in FIG. 2C, the dry film 5 supported at the support 4 is stuck to the first surface 21 of the substrate 1. Thereafter, as illustrated in FIG. 2D, a thickness of the support 4 is preferably reduced to a half or less through polishing, dissolution or peeling.

Figure 3A:
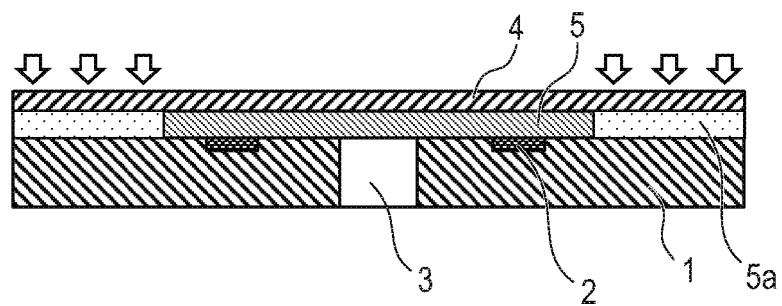
FIGS. 3A and 3B are sectional views illustrating some steps in a transfer method according to a second embodiment of the present disclosure.
Figure 3B:
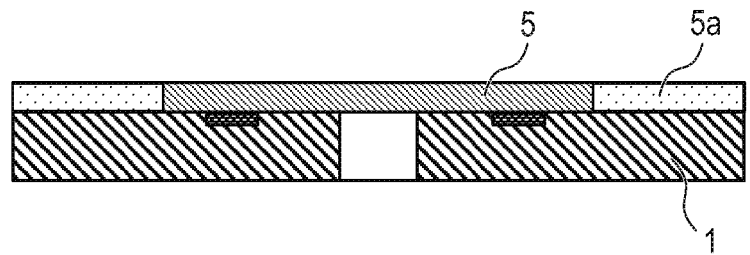

Next, as illustrated in FIG. 3A, the dry film 5 bonded with the thinned support 4 is exposed to light, and thus a pattern serving as the channel 14 illustrated in FIG. 2H is formed. Specifically, for example, since a part of the dry film 5 made of a negative type photosensitive resin is exposed to light and is cured, a portion (a portion serving as a part of the channel formation member 12) 5a serving as a sidewall of the channel 14 is formed, and an unexposed portion is a pattern serving as the channel 14. When the dry film 5 is formed on the support 4 (refer to FIG. 2B) or the dry film 5 is stuck to the substrate 1 (refer to FIG. 2C), there is concern that a surface of the support 4 (non-formation surface) opposite to a surface on which the dry film 5 is formed may be scratched or dust may be attached thereto. In the present embodiment, a thickness of the support 4 is reduced through polishing, dissolution or peeling before exposure is performed on the dry film 5 via the support 4. The support 4 is thinned through the polishing, dissolution or peeling, and thus a scratch or dust on the non-formation surface of the support 4 can be removed. Therefore, the dry film 5 can be exposed to light through the clean support 4 from which a scratch or dust causing a defective pattern is removed. Thereafter, the support 4 is peeled (interfacially peeled) from the dry film 5. FIG. 3B illustrates a state after the support 4 is peeled. In the same manner as in the first embodiment, as illustrated in FIG. 2G, a resin layer 7 serving as a part of the channel formation member 12 (refer to FIG. 1) is formed on the dry film 5 and is exposed to light such that a pattern serving as the ejection ports 11 illustrated in FIG. 2H is formed. Specifically, for example, since a part of the resin layer 7 made of a negative type photosensitive resin is exposed to light and is cured, a portion (a portion serving as another part of the channel formation member 12) 7a serving as a member forming the ejection ports 11 is formed, and an unexposed portion is a pattern serving as the ejection ports 11. The dry film 5 and the resin layer 7 are developed, and thus the channel 14 and the ejection ports 11 are formed as illustrated in FIG. 2H.

Also in the present embodiment, in the same manner as in the first embodiment, since the process of thinning the support 4 is performed between transfer of the dry film 5 and peeling of the support 4, the rigidity of the support 4 is high during transfer of the dry film 5, and the rigidity of the support 4 is low during peeling of the support 4 from the dry film 5. Consequently, it is possible to suppress the dry film 5 from being deformed during transfer of the dry film 5 or the dry film 5 from being deformed or damaged during peeling of the support 4, and thus to form the channel formation member 12 having a desired shape. In the present embodiment, as described above, the dry film 5 is exposed to light through the clean support 4 from which a scratch or dust on the non-formation surface is removed, and thus exposure accuracy is favorable.

Third Embodiment

Figure 4A:
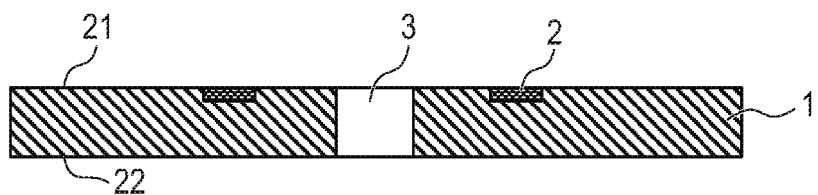
FIGS. 4A, 4B, 4C, 4D, 4E, 4F, 4G and 4H are sectional views sequentially illustrating respective steps in a transfer method according to a third embodiment of the present disclosure.
Figure 4B:
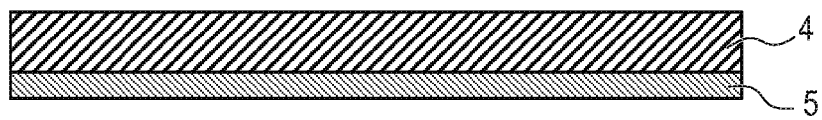

Next, a manufacturing method for a liquid ejection head of a third embodiment of the present disclosure will be described with reference to FIGS. 4A to 4H. In the present embodiment, a substrate 1 as illustrated in FIG. 4A and a dry film 5 supported at a support 4 as illustrated in FIG. 4B are prepared. The substrate 1 and the dry film 5 may be the same as those of the first and second embodiments. However, the support 4 of the present embodiment is made of a material which is soluble and removable. Particularly, the support 4 is preferably made of a material which is soluble by a dissolving liquid which does not dissolve a material (an epoxy resin, an acrylic resin or a urethane resin) of the dry film 5. As an example, the support 4 is preferably made of a polyvinyl alcohol (PVA) film which is easily dissolved by water or warm water. The dry film 5 made of the resin material is dissolved by an organic solvent but is not dissolved by water or warm water.

Figure 4C:
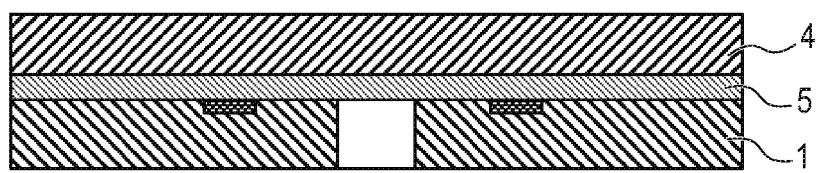
Figure 4D:
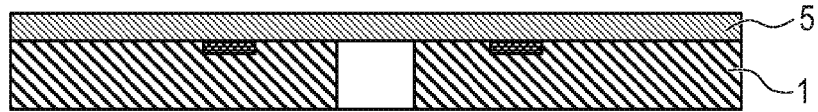
Figure 4E:
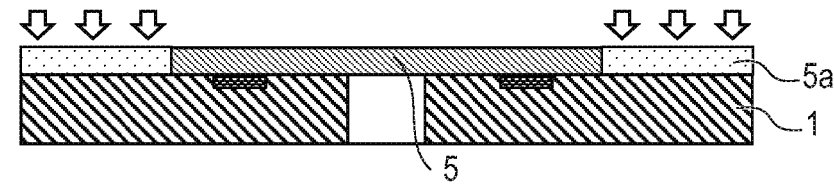

As illustrated in FIG. 4C, the dry film 5 supported at the support 4 is stuck to the first surface 21 of the substrate 1. However, in the present embodiment, unlike in the first and second embodiments, thinning of the support 4 is not performed after the dry film 5 supported at the support 4 is transferred onto the substrate 1. The support 4 is immersed into, for example, warm water so as to be dissolved and removed. FIG. 4D illustrates a state after the support 4 is removed. In this case, the dry film 5 is maintained in an undissolved state. Next, as illustrated in FIG. 4E, the dry film 5 remaining on the substrate 1 is exposed to light such that a pattern serving as the channel 14 illustrated in FIG. 4H is formed. Specifically, since a part of the dry film 5 made of a negative type photosensitive resin is exposed to light and is cured, a portion (a portion serving as a part of the channel formation member 12 (refer to FIG. 1)) 5a serving as a sidewall of the channel 14 is formed, and an unexposed portion is a pattern serving as the channel 14.

Figure 4F:
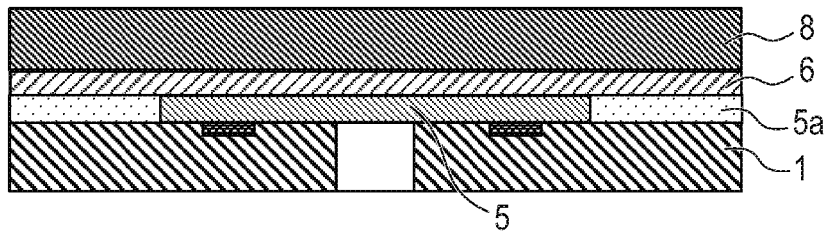
Figure 4G:
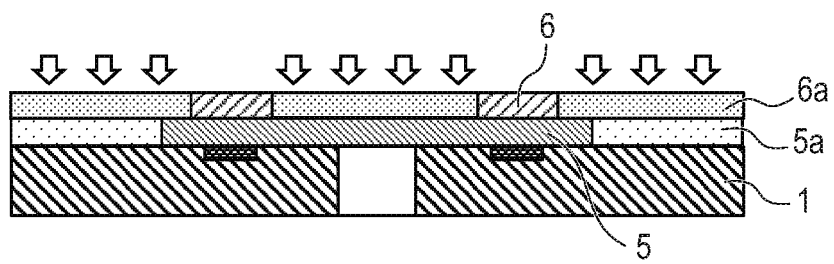
Figure 4H:
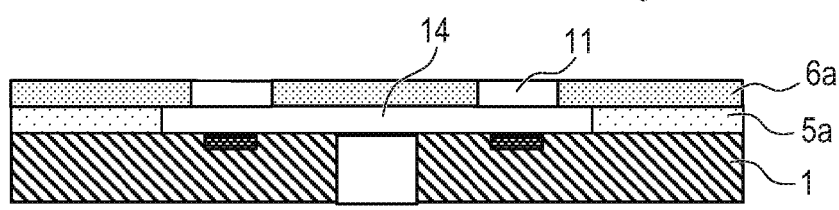

As illustrated in FIG. 4F, another dry film 6 supported at a support 8 was prepared, and the dry film 6 supported at the support 8 was stuck to the dry film 5 provided with the pattern serving as the channel 14. In the present embodiment, the support 8 supporting the dry film 6 is made of the same material as that of the support 4. The support 8 is immersed into, for example, warm water so as to be dissolved and removed. FIG. 4G illustrates a state after the support 8 is removed. The dry film 6 remaining on the dry film 5 is exposed to light such that a pattern serving as the ejection ports 11 illustrated in FIG. 4H is formed. Specifically, since a part of the dry film 6 made of a negative type photosensitive resin is exposed to light and is cured, a portion (a portion serving as another part of the channel formation member 12) 6a serving as a member forming the ejection ports 11 is formed, and an unexposed portion is a pattern serving as the ejection ports 11. As an example, the dry film 6 is made of a material which is adjusted to have sensitivity or a photosensitive wavelength range which is different from that of the dry film 5 by adding a photoacid generator to the same resin material as that of the dry film 5. The dry film 5 and the dry film 6 are developed, and thus the channel 14 and the ejection ports 11 are formed as illustrated in FIG. 4H.

A technical meaning of the present embodiment will now be described. As described above, the support 4 and the support 8 have sufficient rigidity in order to prevent the dry film 5 and the dry film 6 from tracking an uneven shape of a transfer surface so as to be deviated from desired shapes when the dry film 5 and the dry film 6 respectively supported at the support 4 and the support 8 are transferred. If the support 4 and the support 8 having high rigidity are to be mechanically peeled from the dry film 5 and the dry film 6, the dry film 5 and the dry film 6 may be pulled to the support 4 side and the support 8 side so as to be deformed or damaged. Therefore, in the present embodiment, the support 4 and the support 8 are dissolved and removed instead of being mechanically peeled from the dry film 5 and the dry film 6. According to the method, the support 4 and the support 8 can be removed without causing deformation or damage of the dry film 5 and the dry film 6 regardless of the rigidity of the support 4 and the support 8.

In the present embodiment, the dry film 5 and the dry film 6 do not cause cohesion failure unlike in a case where the support 4 and the support 8 are mechanically peeled from the dry film 5 and the dry film 6, and a quality problem due to particles separated from the dry film 5 and the dry film 6 falling and attaching onto the substrate 1 does not occur. In a case where the support 4 is mechanically peeled from the dry film 5, in the support 4, the substrate 1 and the dry film 5, the strength of the support 4, adhesive force between the dry film 5 and the support 4, adhesive force between the dry film 5 and the substrate 1 and the strength of the substrate 1 are all high. In contrast, the strength of the dry film 5 before being cured is relatively low. Therefore, if the support 4 is to be mechanically peeled from the dry film 5, the dry film 5, particularly, a boundary portion between a portion remaining on the substrate 1 and the other portion around an outer periphery of the substrate 1 causes cohesion failure, and thus fragments (particles) are likely to be separated therefrom and flow up in the air. In contrast, in the present embodiment, the support 4 is chemically dissolved and removed instead of being mechanically peeled from the dry film 5, and thus there is no case where the dry film 5 causes cohesion failure and thus fragments are separated. Therefore, quality deterioration due to attachment of fragments of the dry film 5 to the substrate 1 is not caused. Regarding the support 8 and the dry film 6, in the same manner as the support 4 and the dry film 5, the support 8 is chemically dissolved and removed instead of being mechanically peeled from the dry film 6. Therefore, cohesion failure does not occur, and particles are not generated, so that a quality problem caused by the particles does not occur. In the present embodiment, since there is no mechanical peeling (tear-off) step, it is not necessary to perform a process (formation of a release layer) of making releasability of the support 4 and the support 8, and the dry film 5 and the dry film 6 improved by taking into consideration the balance of adhesive force among the support 4 and the support 8, and the dry film 5, the dry film 6 and the substrate 1.

As mentioned above, in the present embodiment, the support 4 and the support 8 are made of a material which is relatively easily dissolved such that the support 4 and the support 8 are dissolved to be removed from the dry film 5 and the dry film 6. Particularly, a combination is preferably employed in which a material of the support 4 and the support 8, and a material of the dry film 5 and the dry film 6 are dissolved by different types of solvents, and a solvent dissolving one material does not dissolve the other material. In other words, preferably, the support 4 and the support 8 are made of a material which is soluble in a solvent for a support and is insoluble in a solvent for a dry film, and the dry film 5 and the dry film 6 are made of a material which is soluble in a solvent for a dry film and is insoluble in a solvent for a support. As a preferable example, the dry film 5 and the dry film 6 are made of a resin material which is dissolved by an organic solvent, and the support 4 and the support 8 are made of a PVA film which is easily dissolved by water or warm water. As another example, a combination is also preferable in which the support 4 and the support 8 are made of an acrylic resin layer, the dry film 5 and the dry film 6 are made of an epoxy resin, a solvent for the supports is a hydrofluoroether solvent, and a solvent for the dry film is PGMEA.

Planar shapes of the support 4 and the support 8, and the dry film 5 and the dry film 6 are not preferably larger than that of the substrate 1 onto which the dry film 5 and the dry film 6 are transferred. If the dry film 5 and the dry film 6 protrude outward of the substrate 1 in a plan view, after the support 4 and the support 8 are removed, portions of the dry film 5 and the dry film 6 exceeding from the substrate 1 have a thin burr shape. There is concern that the burr-shaped portions may be damaged in an after step, and thus particles may be generated. The number of chips obtained from a single substrate 1, that is, the number of chips for liquid ejection heads obtained by dividing the single substrate 1 is preferably as large as possible. The number of obtained chips is generally defined by a size of a chip and a size of a non-effective region of an edge portion of the outer periphery of the substrate 1. A resistance value distribution of energy generation elements formed in the edge portion of the outer periphery of the substrate 1 deteriorates, and thus desired performance cannot be obtained. Therefore, the edge portion cannot be effectively used. Generally, a portion of 1 to 5 mm inward of the edge portion is a non-effective region, and a portion inward thereof is an effective region. Specific sizes of the dry film 5 and the dry film 6 are not particularly limited, but the dry film 5 and the dry film 6 after being transferred are made not to protrude outward from the edge portion of the substrate 1 by taking into consideration the effective region of the substrate 1 and positional accuracy of transfer onto the substrate 1.

EXAMPLES

Hereinafter, more specific Examples of the present disclosure will be described.

Example 1

Example 1 is an Example based on the first embodiment of the present disclosure. First, as illustrated in FIG. 2A, the substrate 1 provided with the energy generation elements 2 made of TaSiN on the first surface 21 side was prepared. The substrate 1 of the present example may be a substrate in which a protective film (not illustrated) made of SiN is formed on a surface of a (100) silicon substrate. The supply path 3 which is open to the first surface 21 is formed in the substrate 1 according to, for example, a Bosch process based on a reactive ion etching (RIE) method. On the other hand, as illustrated in FIG. 2B, the dry film 5 supported at the support 4 was prepared. The support 4 of the present example has a single-layer structure made of PET with a thickness of 100 μm, and was subjected to release treatment on a surface in contact with the dry film 5. The dry film 5 of the present example was formed by applying a solution in which an epoxy resin (N-695 (product name) manufactured by DIC Corporation) and a photoacid generator (CPI-210S (product name) manufactured by San-Apro Ltd.) were dissolved in PGMEA, on the surface of the support 4 subjected to the release treatment.

Next, as illustrated in FIG. 2C, the dry film 5 supported at the support 4 was transferred onto the first surface 21 of the substrate 1 provided with the supply path 3 by using a roll type laminator (VTM-200 (product name) manufactured by Takatori Corporation). A thickness of the transferred dry film 5 was 15 μm. As illustrated in FIG. 2D, a thickness of the support 4 was reduced to 50 μm through polishing using an alumina suspension. The support 4 was interfacially peeled from the dry film 5 in an environment of 25° C. FIG. 2E illustrates a state after the support 4 is peeled. The dry film 5 was exposed to light as illustrated in FIG. 2F by using an exposure device (FPA-3000i5+(product name) manufactured by Canon Inc.), and thus a pattern serving as the channel 14 illustrated in FIG. 2H was formed. Specifically, for example, light with a wavelength of 365 nm was applied at an exposure amount of 5000 J/m², a part of the dry film 5 made of a negative type photosensitive resin was exposed to the light, and then the dry film 5 was baked and cured for five minutes at 50° C. In the above-described way, a portion (a portion serving as a part of the channel formation member 12 (refer to FIG. 1)) 5a serving as a sidewall of the channel 14 was formed, and an unexposed portion was a pattern serving as the channel 14.

Next, as illustrated in FIG. 2G, the resin layer 7 serving as a part of the channel formation member 12 (refer to FIG. 1) was formed on the dry film 5. The resin layer 7 was formed by using a solution in which an epoxy resin (157S70 (product name) manufactured by Japan Epoxy Resin Co., Ltd.) and a photoacid generator (LW-S1 (product name) manufactured by San-Apro Ltd.) were dissolved in PGMEA and which had a sensitivity difference from the dry film 5. Another dry film was formed by using the solution, and was transferred onto the dry film 5 by a roll type laminator such that the resin layer 7 with a thickness of 5 μm was formed. A part of the resin layer 7 made of a negative type photosensitive resin was exposed to light as illustrated in FIG. 2G by using an exposure device (FPA-3000i5+ (product name) manufactured by Canon Inc.), and was then baked and cured for five minutes at 90° C. In the above-described way, a portion (a portion serving as another part of the channel formation member 12) 7a serving as a member forming the ejection ports 11 illustrated in FIG. 2H was formed, and an unexposed portion was a pattern serving as the ejection ports 11. The dry film 5 having the pattern serving as the channel 14 and the resin layer 7 having the pattern serving as the ejection ports 11 were immersed into PGMEA so as to be developed, and thus the channel 14 and the ejection ports 11 were formed as illustrated in FIG. 2H. Finally, electrical connection to a wiring board (not illustrated) was performed such that the liquid ejection head was manufactured. It was checked that there was no defect by observing the liquid ejection head.

Example 2

Figure 5A:
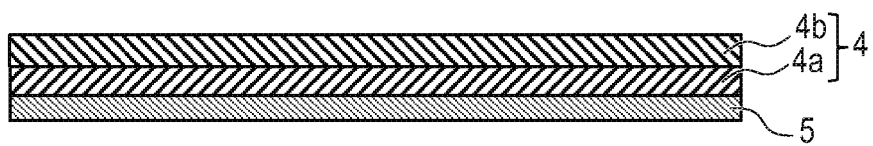
FIGS. 5A, 5B and 5C are sectional views illustrating some steps in a modification example of the transfer method according to the first embodiment of the present disclosure.
Figure 5B:
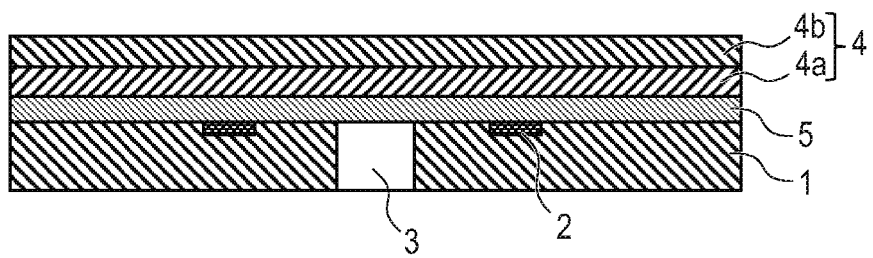
Figure 5C:
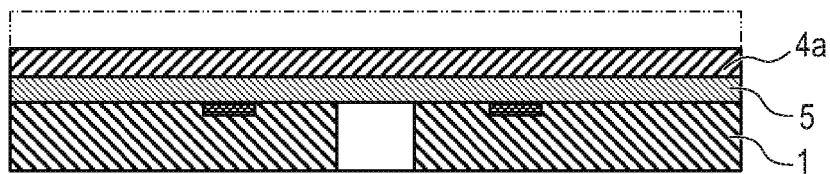

Next, Example 2 which is a modification example based on the first embodiment of the present disclosure will be described. The same portion as in Example 1 will not be described or will be described briefly. A description will be made with reference to FIGS. 2A to 2H and FIGS. 5A to 5C illustrating similar forms although materials of some members are different. In the present example, as illustrated in FIG. 5A, the dry film 5 was stacked on a PET layer 4a by using a film having a multi-layer structure including the PET layer 4a with a thickness of 50 μm and a polyimide layer 4b with a thickness of 50 μm as the support 4. In the same manner as in Example 1, the dry film 5 of the present example was formed by applying a solution in which an epoxy resin (N-695 (product name) manufactured by DIC Corporation) and a photoacid generator (CPI-210S (product name) manufactured by San-Apro Ltd.) were dissolved in PGMEA. As illustrated in FIG. 5B, the dry film 5 supported at the support 4 was transferred onto the same substrate 1 (refer to FIG. 2A) as in Example 1. The polyimide layer 4b with the thickness of 50 μm of the support 4 was removed through polishing using an alumina suspension such that only the PET layer 4a with the thickness of 50 μm was left. FIG. 5C illustrates a state after the polyimide layer 4b is removed. In the same manner as in Example 1, the support 4 (remaining PET layer 4a) was interfacially peeled from the dry film 5. FIG. 2E illustrates a state after the support 4 is peeled. Since a part of the dry film 5 made of a negative type photosensitive resin was exposed to light and was cured, a portion (a portion serving as a part of the channel formation member 12 (refer to FIG. 1)) 5a serving as a sidewall of the channel 14 illustrated in FIG. 2H was formed, and an unexposed portion was a pattern serving as the channel 14 (refer to FIG. 2F). Next, the resin layer 7 made of a negative type photosensitive resin was formed on the dry film 5 (refer to FIG. 2G). Since a part of the resin layer 7 was exposed to light and was cured, a portion (a portion serving as another part of the channel formation member 12) 7a serving as a member forming the ejection ports 11 illustrated in FIG. 2H was formed, and an unexposed portion was a pattern serving as the ejection ports 11. The dry film 5 and the resin layer 7 were developed, and thus the channel 14 and the ejection ports 11 were formed (refer to FIG. 2H). Finally, electrical connection to a wiring board (not illustrated) was performed such that the liquid ejection head was manufactured. It was checked that there was no defect by observing the liquid ejection head in the same manner as in Example 1. According to the present example, in the polishing step (FIG. 5C) before interfacial peeling of the support 4, only a half thickness of the support 4 can be easily removed, and thus the accuracy of the polishing step and the interfacial peeling step is favorable.

Example 3

Next, Example 3 which is another modification example based on the first embodiment of the present disclosure will be described. The same portion as in Examples 1 and 2 will not be described or will be described briefly. A description will be made with reference to FIGS. 2A to 2H and FIGS. 5A to 5C illustrating similar forms although materials of some members are different. In the present example, the dry film 5 was stacked on a PET layer 4a by using a film, similar to that in FIG. 5A, having a multi-layer structure including the PET layer 4a with a thickness of 50 μm and a polyvinyl alcohol (PVA) layer 4b with a thickness of 50 μm as the support 4. In the same manner as in Example 1, the dry film 5 of the present example was formed by applying a solution in which an epoxy resin (N-695 (product name) manufactured by DIC Corporation) and a photoacid generator (CPI-210S (product name) manufactured by San-Apro Ltd.) were dissolved in PGMEA. The dry film 5 supported at the support 4 was transferred onto the same substrate 1 (refer to FIG. 2A) as in Example 1 (refer to FIG. 5B). The PVA layer 4b with the thickness of 50 μm of the support 4 was dissolved and removed by using water such that only the PET layer 4a with the thickness of 50 μm was left. FIG. 5C illustrates a state after the PVA layer 4b is removed. In the same manner as in Example 1, the support 4 (remaining PET layer 4a) was interfacially peeled from the dry film 5. FIG. 2E illustrates a state after the support 4 is peeled. Since a part of the dry film 5 made of a negative type photosensitive resin was exposed to light and was cured, a portion (a portion serving as a part of the channel formation member 12 (refer to FIG. 1)) 5a serving as a sidewall of the channel 14 illustrated in FIG. 2H was formed, and an unexposed portion was a pattern serving as the channel 14 (refer to FIG. 2F). Next, the resin layer 7 made of a negative type photosensitive resin was formed on the dry film 5 (refer to FIG. 2G). Since a part of the resin layer 7 was exposed to light and was cured, a portion (a portion serving as another part of the channel formation member 12) 7a serving as a member forming the ejection ports 11 illustrated in FIG. 2H was formed, and an unexposed portion was a pattern serving as the ejection ports 11. The dry film 5 and the resin layer 7 were developed, and thus the channel 14 and the ejection ports 11 were formed (refer to FIG. 2H). Finally, electrical connection to a wiring board (not illustrated) was performed such that the liquid ejection head was manufactured. It was checked that there was no defect by observing the liquid ejection head in the same manner as in Examples 1 and 2. According to the present example, in the same manner as in Example 2, only a half thickness of the support 4 can be easily removed, and thus the accuracy of the interfacial peeling step is favorable. Further, it is possible to easily remove the PVA layer 4b at low cost by using water.

Example 4

Next, Example 4 which is still another modification example based on the first embodiment of the present disclosure will be described. The same portion as in Examples 1 to 3 will not be described or will be described briefly. A description will be made with reference to FIGS. 2A to 2H and FIGS. 5A to 5C illustrating similar forms although materials of some members are different. In the present example, a film (refer to FIG. 5A) having a multi-layer structure including a PET layer 4a with a thickness of 50 μm and a polyimide layer 4b with a thickness of 50 μm was used as the support 4. Release treatment was performed on a front surface (a surface on which the dry film 5 was formed) of the PET layer 4a of the support 4 and between the PET layer 4a and the polyimide layer 4b. Regarding the release treatment between the PET layer 4a and the polyimide layer 4b, the release treatment may be performed on only the PET layer 4a, the release treatment may be performed on only the polyimide layer 4b, and the release treatment may be performed on both of the PET layer 4a and the polyimide layer 4b. In any case, a portion between the PET layer 4a and the polyimide layer 4b was made to have releasability higher than that of the front surface (the surface on which the dry film 5 was formed) of the PET layer 4a. The dry film 5 was stacked on the PET layer 4a. In the same manner as in Example 1, the dry film 5 of the present example was formed by applying a solution in which an epoxy resin (N-695 (product name) manufactured by DIC Corporation) and a photoacid generator (CPI-210S (product name) manufactured by San-Apro Ltd.) were dissolved in PGMEA.

The dry film 5 supported at the support 4 was transferred onto the same substrate 1 (refer to FIG. 2A) as in Example 1 (refer to FIG. 5B). The polyimide layer 4b with the thickness of 50 μm of the support 4 was removed through polishing such that only the PET layer 4a with the thickness of 50 μm was left. FIG. 5C illustrates a state after the polyimide layer 4b is removed. In the same manner as in Example 1, the support 4 (remaining PET layer 4a) was interfacially peeled from the dry film 5. FIG. 2E illustrates a state after the support 4 is peeled. Since a part of the dry film 5 made of a negative type photosensitive resin was exposed to light and was cured, a portion (a portion serving as a part of the channel formation member 12 (refer to FIG. 1)) 5a serving as a sidewall of the channel 14 illustrated in FIG. 2H was formed, and an unexposed portion was a pattern serving as the channel 14 (refer to FIG. 2F). Next, the resin layer 7 made of a negative type photosensitive resin was formed on the dry film 5 (refer to FIG. 2G). Since a part of the resin layer 7 was exposed to light and was cured, a portion (a portion serving as another part of the channel formation member 12) 7a serving as a member forming the ejection ports 11 illustrated in FIG. 2H was formed, and an unexposed portion was a pattern serving as the ejection ports 11. The dry film 5 and the resin layer 7 were developed, and thus the channel 14 and the ejection ports 11 were formed (refer to FIG. 2H). Finally, electrical connection to a wiring board (not illustrated) was performed such that the liquid ejection head was manufactured. It was checked that there was no defect by observing the liquid ejection head in the same manner as in Examples 1 to 3. According to the present example, since the release treatment is performed, in the polishing step before interfacial peeling of the support 4, only a half thickness of the support 4 is removed, and thus it is possible to peel the support 4 from the dry film 5 with high accuracy. Particularly, in a case where releasability between the PET layer 4a and the polyimide layer 4b is higher than releasability of the front surface (the surface on which the dry film 5 is formed) of the PET layer 4a, the occurrence of interfacial peeling is suppressed during inter-layer peeling, and thus peeling treatment can be performed with higher accuracy.

Example 5

Next, Example 5 which is based on the second embodiment of the present disclosure will be described. The same portion as in Examples 1 to 4 will not be described or will be described briefly. A description will be made with reference to FIGS. 2A to 2H and FIGS. 3A and 3B illustrating similar forms although materials of some members are different. In the present example, the same substrate 1 (refer to FIG. 2A) as in Example 1 and the same support 4 and dry film 5 (refer to FIG. 2B) as in Example 1 were prepared, and the dry film 5 was transferred onto the substrate 1 (refer to FIG. 2C). A thickness of the support 4 was reduced to 50 μm through polishing (refer to FIG. 2D). In the present example, light with a wavelength of 365 nm was applied at an exposure amount of 5000 J/m$^2$ by using an exposure device (FPA-3000i5+(product name) manufactured by Canon Inc.), in a stacked state without the remaining support 4 being peeled from the dry film 5 as illustrated in FIG. 3A. Consequently, a part of the dry film 5 made of a negative type photosensitive resin was exposed to the light through the support 4, and then the dry film 5 was baked and cured for five minutes at 50° C. In the above-described way, a portion (a portion serving as a part of the channel formation member 12 (refer to FIG. 1)) 5a serving as a sidewall of the channel 14 illustrated in FIG. 2H was formed, and an unexposed portion was a pattern serving as the channel 14. The support 4 was interfacially peeled from the dry film 5. FIG. 3B illustrates a state after the support 4 is peeled. Thereafter, in the same manner as in Example 1, the resin layer 7 made of a negative type photosensitive resin was formed on the dry film 5 (refer to FIG. 2G). Since a part of the resin layer 7 was exposed to light and was cured, a portion (a portion serving as another part of the channel formation member 12) 7a serving as a member forming the ejection ports 11 illustrated in FIG. 2H was formed, and an unexposed portion was a pattern serving as the ejection ports 11. The dry film 5 and the resin layer 7 were developed, and thus the channel 14 and the ejection ports 11 were formed (refer to FIG. 2H). Finally, electrical connection to a wiring board (not illustrated) was performed such that the liquid ejection head was manufactured. It was checked that there was no defect by observing the liquid ejection head in the same manner as in Examples 1 to 4. As mentioned above, even in a case where pattern exposure is performed before interfacial peeling, a channel with high accuracy can be formed.

Example 6

Figure 6A:
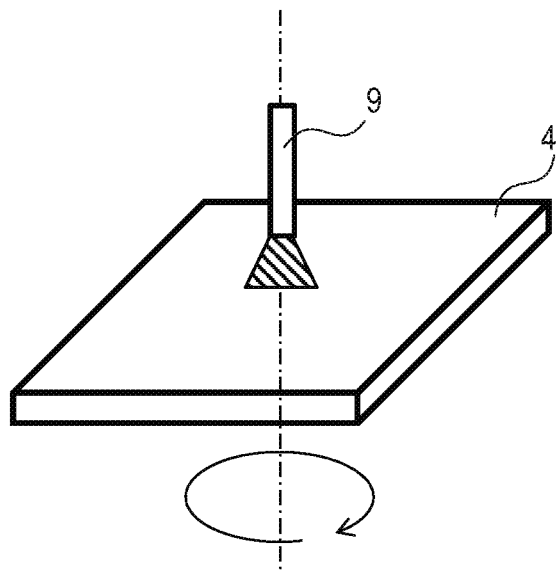
FIGS. 6A, 6B and 6C are sectional views illustrating some steps in a modification example of the transfer method according to the third embodiment of the present disclosure.
Figure 6B:
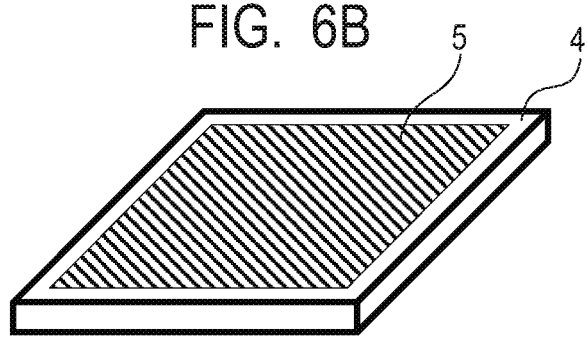
Figure 6C:
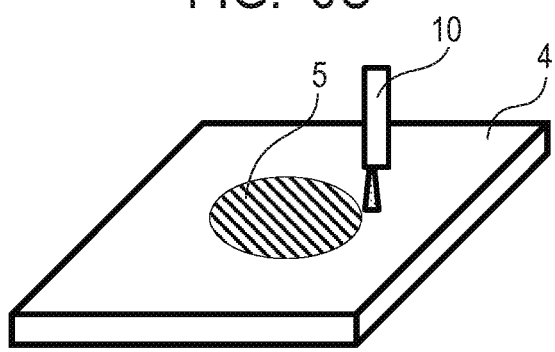

Next, Example 6 based on the third embodiment of the present disclosure will be described. The same portion as in Examples 1 to 5 will not be described or will be described briefly. A description will be made with reference to FIGS. 4A to 4H and FIGS. 6A to 6C illustrating similar forms although materials of some members are different. In the present example, as illustrated in FIG. 4B, a film having a single-layer structure formed of a polyvinyl alcohol (PVA) sheet (Poval Film manufactured by Kuraray Co., Ltd.) with a thickness of 80 μm was used as the support 4. The dry film 5 was formed by applying a solution in which an epoxy resin (N-695 (product name) manufactured by DIC Corporation) and a photoacid generator (CPI-210S (product name) manufactured by San-Apro Ltd.) were dissolved in PGMEA on the support 4 formed of the PVA sheet according to spin coating. In this case, a planar shape of the dry film 5 is smaller than a planar shape of the substrate 1 onto which the dry film 5 is transferred next. In the present example, the substrate 1 with a diameter of 200 mm (refer to FIG. 4A) was used. Therefore, as illustrated in FIGS. 6A and 6B, the solution was applied on the support 4 by using a spin coating device 9, then only a region within 95 mm from the center of the dry film 5 was left, and a portion outside thereof was removed by using a side rinse device 10 using PGMEA. In the above-described way, as illustrated in FIG. 6C, the dry film 5 of which a planar shape is a circular shape with a diameter of 190 mm was formed. The dry film 5 was transferred onto the first surface 21 of the substrate 1 such that the dry film 5 does not protrude outward the substrate 1 in a plan view (refer to FIG. 4C). The dry film 5 was transferred by using a roll type laminator (VTM-200 (product name) manufactured by Takatori Corporation), and a thickness of the transferred dry film 5 was 15 μm. The support 4 may protrude outward of the substrate 1 in a plan view. For example, the support 4 was cut by using a cutter after the dry film 5 was transferred, and thus had a circular planar shape with a diameter of 210 mm larger than the substrate 1.

The support 4 was immersed into warm water of 50° C. for ten minutes, so as to be dissolved and removed. FIG. 4D illustrates a state after the support 4 is removed. Thereafter, the dry film 5 and the substrate 1 were dried with a centrifugal drier. The dry film 5 made of a negative type photosensitive resin was irradiated with and exposed to light with a wavelength of 365 nm at an exposure amount of 5000 J/m$^2$ by using an exposure device (FPA-3000i5+(product name) manufactured by Canon Inc.) as illustrated in FIG. 4E. The dry film 5 was baked and cured for five minutes at 50° C. In the above-described way, a portion (a portion serving as a part of the channel formation member 12 (refer to FIG. 1)) 5a serving as a sidewall of the channel 14 illustrated in FIG. 4H was formed, and an unexposed portion was a pattern serving as the channel 14. Thereafter, as illustrated in FIG. 4F, another dry film 6 supported at a support 8 was prepared, and the dry film 6 supported at the support 8 was transferred onto the dry film 5 provided with the pattern serving as the channel 14. The support 8 is made of the same material as that of the support 4 and has the same dimension as that thereof. The dry film 6 was formed by using a solution in which an epoxy resin (157S70 (product name) manufactured by Japan Epoxy Resin Co., Ltd.) and a photoacid generator (LW-S1 (product name) manufactured by San-Apro Ltd.) were dissolved in PGMEA and which had a sensitivity difference from the dry film 5. The solution was applied on the support 8, and thus the dry film 6 made of a negative type photosensitive resin was formed. A planar shape of the dry film 6 is a circular shape with a diameter of 190 mm in the same manner as the dry film 5. The dry film 6 supported at the support 8 was transferred onto the dry film 5 by using a roll type laminator, and a thickness of the transferred dry film 6 was 5 μm. The support 8 as immersed into, for example, warm water so as to be dissolved and removed. As illustrated in FIG. 4G, a part of the dry film 6 remaining on the dry film 5 was exposed to light and was cured. Consequently, a portion (a portion serving as another part of the channel formation member 12) 6a serving as a member forming the ejection ports 11 illustrated in FIG. 4H was formed, and an unexposed portion was a pattern serving as the ejection ports 11. The dry film 5 and the dry film 6 were developed, and thus the channel 14 and the ejection ports 11 were formed (refer to FIG. 4H). Finally, electrical connection to a wiring board (not illustrated) was performed such that the liquid ejection head was manufactured. It was checked that there was no defect by observing the liquid ejection head in the same manner as in Examples 1 to 5. According to the present example, a process such as polishing or dissolution for thinning the support 4 and the support 8 is not necessary, and the support 4 and the support 8 can be easily removed at low cost by using water.

Example 7

Next, Example 7 which is a modification example based on the third embodiment of the present disclosure will be described. The same portion as in Example 6 will not be described or will be described briefly. A description will be made with reference to FIGS. 4A to 4H illustrating similar forms although materials of some members are different. In the present example, the dry film 5 which was made of the same material as in Example 6 and of which a planar shape was a circular shape with a diameter of 190 mm was formed on the first surface 21 of the support 4 having a single-layer structure formed of an acryl film (Acryplen (product name) manufactured by Mitsubishi Chemical Corporation) with a thickness of 80 μm. The dry film 5 (refer to FIG. 4B) supported at the support 4 was transferred onto the substrate 1 (refer to FIG. 4A) which is the same as in Examples 1 to 6 (refer to FIG. 4C). The support 4 was immersed into a chemical bath of hydrofluoroether (AE-3000 (product name) manufactured by AGC Inc.) for twenty minutes at normal temperature so as to be dissolved and removed. FIG. 4D illustrates a state after the support 4 is removed. In the same manner as in Example 6, as illustrated in FIG. 4E, a part of the dry film 5 made of a negative type photosensitive resin was exposed to light and was cured. Consequently, a portion (a portion serving as a part of the channel formation member 12 (refer to FIG. 1)) 5a serving as a sidewall of the channel 14 illustrated in FIG. 4H was formed, and an unexposed portion was a pattern serving as the channel 14. As illustrated in FIG. 4F, another dry film 6 supported at a support 8 and made of a negative type photosensitive resin was prepared, and the dry film 6 was transferred onto the dry film 5 provided with the pattern serving as the channel 14. The support 8 is made of the same material as that of the support 4 and has the same dimension as that thereof. The dry film 6 was formed by using a solution in which an epoxy resin (157S70 (product name) manufactured by Japan Epoxy Resin Co., Ltd.) and a photoacid generator (LW-S1 (product name) manufactured by San-Apro Ltd.) were dissolved in PGMEA and which had a sensitivity difference from the dry film 5. The dry film 6 supported at the support 8 was transferred onto the dry film 5. The support 8 was immersed into hydrofluoroether so as to be dissolved and removed. As illustrated in FIG. 4G, a part of the dry film 6 remaining on the dry film 5 was exposed to light and was cured. Consequently, a portion (a portion serving as another part of the channel formation member 12) 6a serving as a member forming the ejection ports 11 illustrated in FIG. 4H was formed, and an unexposed portion was a pattern serving as the ejection ports 11. The dry film 5 and the dry film 6 were developed, and thus the channel 14 and the ejection ports 11 were formed (refer to FIG. 4H). Finally, electrical connection to a wiring board (not illustrated) was performed such that the liquid ejection head was manufactured. It was checked that there was no defect by observing the liquid ejection head in the same manner as in Examples 1 to 6. According to the present example, a process such as polishing or dissolution for thinning the support 4 and the support 8 is not necessary. The hydrofluoroether used in the present example is known as dissolving acrylic resins and not dissolving epoxy resins and is thus generally used as a detergent in a case where a structural body made of an epoxy resin is used in micromachining processing. Therefore, as in the present example, in a case where the support 4 and the support 8 are acryl films, and the dry film 5 and the dry film 6 are made of an epoxy resin, the support 4 and the support 8 can be removed favorably without influencing the dry film 5 and the dry film 6.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-135903, filed Jul. 19, 2018, which is hereby incorporated by reference herein in its entirety.

What is claimed is:

1. A manufacturing method for a liquid ejection head including a channel formation member which has an ejection port ejecting a liquid and a channel communicating with the ejection port, a substrate on which the channel formation member is stacked and has a supply path communicating with the channel, and an energy generation element which generates energy for ejecting the liquid, the method comprising:
   sticking the channel formation member supported at a support to the substrate;
   thinning the support after the sticking of the channel formation member to the substrate; and
   peeling the support from the channel formation member after the thinning of the support and before exposing the channel formation member by light.

2. The manufacturing method for the liquid ejection head according to claim 1, further comprising:
   exposing the channel formation member to light so as to form a pattern serving as the channel; and
   developing the channel formation member to be partially removed, and thus forming the channel.

3. The manufacturing method for the liquid ejection head according to claim 1,
   wherein the channel formation member is a dry film.

4. The manufacturing method for the liquid ejection head according to claim 1,
   wherein the support has a single-layer structure.

5. The manufacturing method for the liquid ejection head according to claim 4,
   wherein the thinning of the support is performed by polishing the support.

6. The manufacturing method for the liquid ejection head according to claim 1,
   wherein the support has a multi-layer structure.

7. The manufacturing method for the liquid ejection head according to claim 6,
   wherein, in the thinning of the support, among layers forming the support, at least one layer is removed through polishing.

8. The manufacturing method for the liquid ejection head according to claim 6,
   wherein, in the thinning of the support, among layers forming the support, at least one layer is removed through dissolution.

9. The manufacturing method for the liquid ejection head according to claim 6, wherein, in the thinning of the support, among layers forming the support, at least one layer is removed through peeling.

\* \* \* \* \*